Jan. 10, 1961 F. E. VACCARO 2,967,973
TUNABLE MAGNETRON WITH COMPENSATING IRIS
Filed May 19, 1955
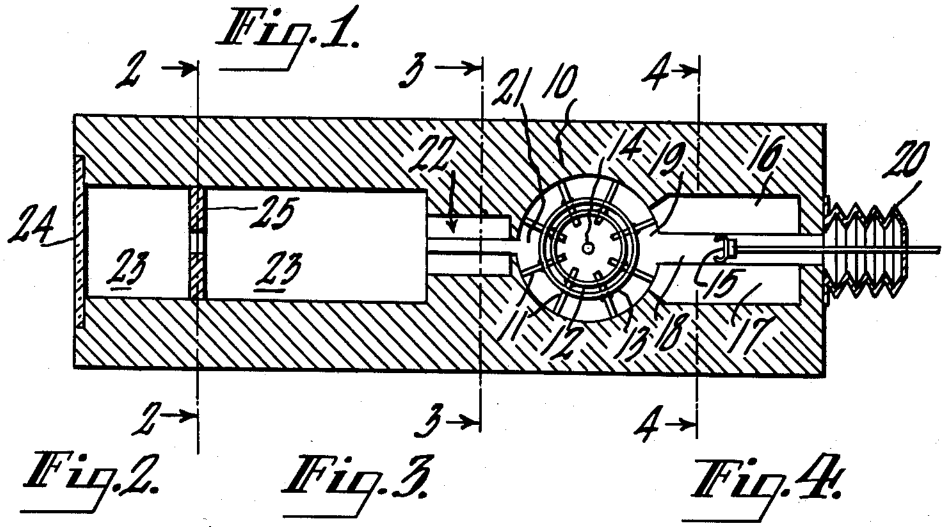
Fig. 1.
Fig. 2. Fig. 3. Fig. 4.
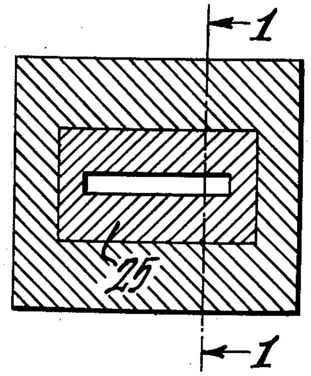
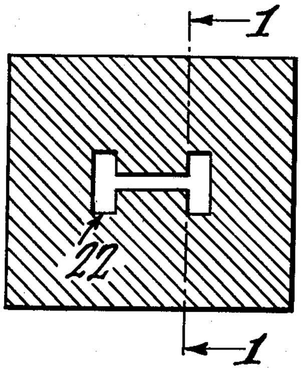
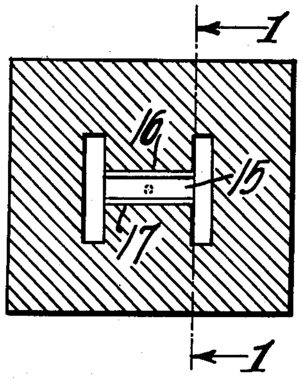
Fig. 5.
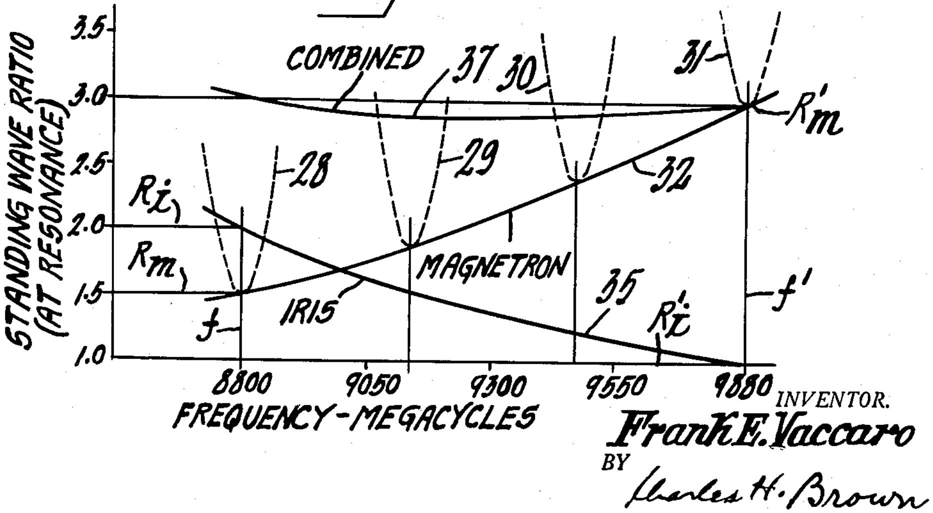
INVENTOR.
Frank E. Vaccaro
BY
Charles H. Brown
ATTORNEY United States Patent Office 2,967,973

Patented Jan. 10, 1961

2,967,973

TUNABLE MAGNETRON WITH COMPENSATING IRIS

Frank E. Vaccaro, Orange, N.J., assignor to Radio Corporation of America, a corporation of Delaware Filed May 19, 1955, Ser. No. 509,465

6 Claims. (Cl. 315—39.53)

This invention relates to tunable magnetrons, and more particularly to a tunable magnetron system including an iris in the output waveguide which automatically compensates for impedance changes in the magnetron over the tuning range thereof.

A magnetron having an anode block composed of a plurality of resonators may be tuned by means of a plunger in a tuning cavity located externally of and coupled to one of the resonators in the anode block. Alternatively, a plurality of such tuning cavities may be coupled to an equal plurality of respective resonators in the anode block of the magnetron and provided with mechanically ganged tuning plungers. When one or a few tuning cavities are employed, the fields in the magnetron are increasingly distorted from perfect symmetry as the tuning cavity size is increased to lower the frequency of oscillation of the magnetron. The distortion or dissymmetry introduced by the tuning cavity causes an impedance change at the output of the magnetron so that there is a decrease in the amount of energy coupled to the load. It is therefore a general object of this invention to provide an improved tunable magnetron system which delivers a substantially constant output to the load over a wide tuning range.

It is another object to provide an improved tunable magnetron system including means to automatically compensate for impedance changes in the magnetron over a wide tuning range.

It is a further object to provide a tunable magnetron having a resonant iris in the output waveguide to automatically maintain a high circuit efficiency over the tuning range of the magnetron.

An illustrative physical embodiment of the invention may comprise a magnetron having an anode circuit which includes a plurality of coupled resonators. An output transformer couples energy from one resonator to an output waveguide. A tuning cavity having a tuning plunger is coupled to a different one of the resonators. The output impedance of the magnetron at the output side of the output transformer varies with the position of the tuning plunger. A series impedance transforming device in the form of an iris is positioned in the output waveguide to automatically compensate for the change in impedance with tuning so that a substantially constant output is obtained.

These and other objects and aspects of the invention will be apparent to those skilled in the art from the following more detailed description taken in conjunction with the appended drawings, wherein:

Figure 1 is a sectional view through a magnetron system constructed according to the teachings of this invention;

Figure 2 is a sectional view taken on the line 2—2 of Figure 1;

Figure 3 is a sectional view taken on the line 3—3 of Figure 1;

Figure 4 is a sectional view taken on the line 4—4 of Figure 1; and

Figure 5 is a chart which will be used in explaining the construction and performance of a system according to the invention.

The tunable magnetron system shown in Figures 1 thru 4 includes a metallic anode block 10 having an evacuated chamber provided with a plurality of radially extending metallic vanes or partitions which define a plurality of cavity resonators. The resonators are coupled together by means of the usual metallic straps 12 and 13. A central cathode 14 provides electrons which are acted upon by a magnetic field from a magnet (not shown). This magnet may include north and south pole pieces disposed at opposite ends of the cathode electrode.

The magnetron is tuned by means of a tuning plunger 15 which makes contact with ridges 16 and 17 of a ridge waveguide tuning cavity 18. The tuning cavity 18 is coupled to a resonator 19 in the anode block. A vacuum seal is maintained, while permitting movement of the tuning plunger 15, by means of the usual bellows construction 20.

A resonator 21 in the anode block is coupled by means of a ridge waveguide impedance transformer 22 to an output waveguide 23. The output waveguide is provided with a window 24 which is transparent to the high frequency energy and which provides a vacuum seal. All the cavities between the window 24 and the bellows 20 are in communication and are evacuated. The window 24 may, of course, be positioned closer to the magnetron if desired. It is essential that the region surrounding the cathode 14 be evacuated, and the position of the seals will be determined by electrical and manufacturing considerations. Flanges (not shown) may be provided for connecting a waveguide having the same dimensions as waveguide 23 from the end of waveguide 23 at which window 24 is located to a load utilizing the high frequency energy passing through the window.

An iris 25 is positioned in the output waveguide 23 so that a substantially constant output coupling is provided from the magnetron throughout the tuning range of the magnetron.

In the absence of an iris 25, the energy coupled from the magnetron to the output waveguide 23 varies with the position of the tuning plunger 15. When the tuning plunger 15 is moved inwardly until the tuning cavity 18 is of substantially zero volume, resonator 19 is electrically the same as the other resonators in the anode block, and the electric and magnetic fields in the anode block are symmetrical. When the tuning plunger 15 is withdrawn to enlarge the volume of the tuning cavity 18 and provide a lower frequency of oscillation in the magnetron, the effect of the tuning cavity 18 is to somewhat distort the electric and magnetic fields in the anode block. That is, the fields depart from perfect symmetry with the result that the fields in the resonator 21 are different than previously. This changes the coupling from the resonator 21 to the impedance transformer 22 and to the output waveguide 23.

Reference will now be made to Figure 5 in connection with a description of the manner in which the iris 25 may be designed to perform the desired function of matching the magnetron to the output waveguide over a broad tuning range. Energy from a signal generator is applied through a slotted line to the output waveguide 23 of the magnetron. The magnetron itself is not otherwise energized. The tuning plunger 15 is positioned at the low frequency end of the tuning range, and the frequency of the signal generator is varied. Voltage standing wave ratio (VSWR) curves at various frequencies of the signal generator are measured by means of the slotted line and plotted to form the dotted line curve 28. The tuning plunger 15 is readjusted to a number of additional positions and similar VSWR curves 29 thru 31 are determined. Procedures for measuring standing wave ratios are described starting at page 705 of "Microwave Magnetrons," vol. 6, Radiation Laboratory Series. (The magnetron is assumed to be overcoupled or Case 1 as determined and described in the book. The method of compensating an undercoupled magnetron will be described following the description of the overcoupled case.)

The bottom ends of the curves 28 thru 31 are connected by a curve 32 which represents the variation in the VSWR at resonance throughout the tuning range of the magnetron, looking from the output waveguide 23 into the impedance transformer 22 and the anode block. Using the curves of Figure 5 by way of example, it will be noted that the magnetron appears from the waveguide 23 to present a VSWR at resonance having a value of three at the high end of the tuning range, and to present a VSWR at resonance of 1.5 at the low end of the tuning range. According to the invention, an iris 25 is inserted in the output waveguide 23 to present a discontinuity so that looking toward the iris from the output waveguide 23 the VSWR at resonance appears substantially constant throughout the tuning range of the magnetron.

According to the voltage standing wave ratio theorem, two lossless discontinuities in a lossless and uniform transmission line may be adjustably positioned with respect to each other to provide a maximum VSWR equal to the product of the insertion VSWR of each one individually. The VSWR provided by an iris alone in a matched waveguide is unity at the resonant frequency of the iris. It is desirable that the iris present as small a discontinuity as possible and yet provide the desired compensation. This is accomplished by making the iris resonant at the high end of the tuning range and by making the VSWR introduced by the iris alone in a matched waveguide multiplied by the VSWR at resonance presented by the magnetron alone at the low end of the tuning range equal to the VSWR at resonance presented by the magnetron alone at the high end of the tuning range.

From the foregoing considerations it will be seen that the curve 35 represents the characteristic of the iris alone in a matched waveguide which will substantially compensate for the characteristic 32 of the magnetron to provide a combined characteristic 37. The iris should provide an individual VSWR in a matched waveguide at the low frequency $f$ equal to 2 so that when multiplied by a 1.5, the VSWR at resonance of the magnetron alone, the product will be 3. This is the same value as the VSWR at resonance presented by the magnetron alone at the high frequency $f'$. Stated another way, the VSWR $R_1$ of the iris alone in a matched waveguide at frequency $f$ is equal to the VSWR $R_m'$ at resonance of the magnetron alone at frequency $f'$ divided by the VSWR $R_m$ at resonance of the magnetron alone at frequency $f$.

The iris is therefore designed to be resonant at the frequency $f'$ at the high end of the tuning range, and to have a Q which conforms with the curve 35 in Figure 5. The resonant frequency of the iris is primarily determined by the dimensions of the aperture in the iris. Various dimensions for a given frequency may be determined from formulas or from design data. The Q of the iris (the slope and shape of the curve 35) is determined primarily by the thickness of the walls of the iris. Formulas for constructing resonant irises are given following page 169 in "Principles of Microwave Circuits," vol. 8, Radiation Laboratory Series.

After the iris has been independently designed and constructed to exhibit the characteristics which conform with curve 35 of Figure 5, the iris is positioned in the output waveguide 23 at varying distances from the output transformer 22 until a position is found at which the combined effect on the standing wave ratio of the iris and the overcoupled magnetron is the product of the two. This position is most conveniently and accurately determined experimentally with the aid of a signal generator and a slotted line.

After the iris is fixed in the desired position, the magnetron system is employed in the usual manner as a source of high frequency energy. The oscillations generated in the anode block 10 are coupled through the output transformer 22 and the output waveguide 23 including the iris 25 to the load.

If the magnetron is undercoupled at the low frequency end of the tuning range, it is desirable to design the iris in accordance with the second part of the voltage standing wave ratio theorem which states: Two lossless discontinuities in a lossless and uniform transmission line may be adjustably positioned with respect to each other to provide a minimum VSWR equal to the insertion VSWR of the larger one alone divided by the insertion VSWR of the smaller one alone. In the undercoupled case, the iris is designed to then be resonant at the upper frequency of the tuning range and to present an insertion VSWR at the lower frequency, which when divided by the VSWR of the magnetron at the lower frequency, is equal to the desired combined value. For example, if the magnetron alone has a characteristic as shown by curve 32 in Fig. 5 and is undercoupled, the iris is made to be resonant at the higher frequency $f'$ and to have an insertion VSWR at the lower frequency $f$ such that when divided by 1.5 the quotient is 3. This is satisfied by a value of 4.5. Stated another way, the VSWR of the iris at frequency $f$ is made equal to the VSWR at frequency $f'$ of the magnetron alone (3) multiplied by the VSWR at frequency $f$ of the magnetron alone (1.5). This product is 4.5.

It is apparent that according to this invention there is provided a tunable magnetron system wherein a substantially constant amount of energy is coupled to the load over a wide tuning range.

What is claimed is:

1. A magnetron system, comprising, an anode block having a plurality of resonators, tuning means coupled to at least one of said resonators to tune said anode block over a frequency range from $f$ to $f'$, where $f'$ is at the high end of the range, an output waveguide coupled to another of said resonators, said anode block presenting a standing wave ratio R at resonance at frequency $f$ and R′ at frequency $f'$, and an iris mounted in said output waveguide, said iris being proportioned to be resonant at frequency $f'$ and to present an individual standing wave ratio at resonance at frequency $f$ substantially equal to $R'/R$.

2. In a magnetron system, an anode block having a plurality of resonators, tuning means coupled to at least one of said resonators to tune said anode block over a frequency range from $f$ to $f'$, where $f'$ is at the high end of the range, an output waveguide, an impedance transformer coupling another of said resonators to said output waveguide, said impedance transformer and anode block presenting a standing wave ratio R at resonance at frequency $f$ and R′ at frequency $f'$, and an iris mounted in said output waveguide, said iris being proportioned to be resonant at frequency $f'$ and to present a voltage standing wave ratio at resonance at frequency $f$ substantially equal to $R'/R$.

3. A magnetron system, comprising, an anode block having a plurality of resonators, tuning means coupled to at least one of said resonators to tune said anode block over a frequency range from $f$ to $f'$, where $f'$ is at the high end of the range, an output waveguide coupled to another of said resonators, said anode block presenting a standing wave ratio R at resonance at frequency $f$ and R′ at frequency $f'$, and an iris mounted in said output waveguide, said iris being proportioned to be resonant at frequency $f'$ and to present an individual standing wave ratio at resonance at frequency $f$ substantially equal to R′ times R.

4. In a magnetron system, an anode block having a plurality of resonators, tuning means coupled to at least one of said resonators to tune said anode block over a frequency range from $f$ to $f'$, where $f'$ is at the high end of the range, an output waveguide, an impedance transformer coupling another of said resonators to said output waveguide, said impedance transformer and anode block presenting a standing wave ratio R at resonance at frequency $f$ and R' at frequency $f'$, and an iris mounted in said output waveguide, said iris being proportioned to be resonant at frequency $f'$ and to present a voltage standing wave ratio at resonance at frequency $f$ substantially equal to R' times R.

5. A magnetron system, comprising, an anode block having a plurality of resonators, tuning means coupled to at least one of said resonators to tune said anode block over a frequency range from $f$ to $f'$, where $f'$ is at the high end of the range, an output waveguide coupled to another of said resonators, said anode block presenting a standing wave ratio R at resonance at frequency $f$ and R' at frequency $f'$, and an iris mounted in said output waveguide, said iris being proportioned to be resonant at frequency $f'$ and to present an individual standing wave ratio at resonance at frequency $f$ which in combination with R equals R'.

6. In a magnetron system, an anode block having a plurality of resonators, tuning means coupled to at least one of said resonators to tune said anode block over a frequency range from $f$ to $f'$, where $f'$ is at the high end of the range, an output waveguide, an impedance transformer coupling another of said resonators to said output waveguide, said impedance transformer and anode block presenting a standing wave ratio R at resonance at frequency $f$ and R' at frequency $f'$, and an iris mounted in said output waveguide, said iris being proportioned to be resonant at frequency $f'$ and to present a voltage standing wave ratio at resonance at frequency $f$ which in combination with R equals R'.

References Cited in the file of this patent

UNITED STATES PATENTS

| | | |
|---|---|---|
| 2,407,069 | Fiske | Sept. 3, 1946 |
| 2,416,168 | Fiske | Feb. 18, 1947 |
| 2,435,984 | Spencer | Feb. 17, 1948 |
| 2,501,545 | Sproull | Mar. 21, 1950 |
| 2,523,841 | Nordsieck | Sept. 26, 1950 |
| 2,644,889 | Finke et al. | July 7, 1953 |
| 2,658,165 | Evans et al. | Nov. 3, 1953 |
| 2,787,711 | Glass | Apr. 2, 1957 |
| 2,790,928 | Reed | Apr. 30, 1957 |
| 2,824,998 | Molnar | Feb. 25, 1958 |